(12) United States Patent
Okawa

(10) Patent No.: US 10,361,267 B2
(45) Date of Patent: Jul. 23, 2019

(54) SEMICONDUCTOR DEVICE

(71) Applicant: TOYOTA JIDOSHA KABUSHIKI KAISHA, Toyota-shi, Aichi-ken (JP)

(72) Inventor: Takashi Okawa, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 119 days.

(21) Appl. No.: 15/792,325

(22) Filed: Oct. 24, 2017

(65) Prior Publication Data

US 2018/0158898 A1    Jun. 7, 2018

(30) Foreign Application Priority Data

Dec. 7, 2016  (JP) .................................. 2016-237928

(51) Int. Cl.

| H01L 29/78 | (2006.01) |
|---|---|
| H01L 29/06 | (2006.01) |
| H01L 21/04 | (2006.01) |
| H01L 21/02 | (2006.01) |
| H01L 29/66 | (2006.01) |
| H01L 29/16 | (2006.01) |
| H01L 29/10 | (2006.01) |

(52) U.S. Cl.
CPC .... *H01L 29/0634* (2013.01); *H01L 21/02529* (2013.01); *H01L 21/02579* (2013.01); *H01L 21/046* (2013.01); *H01L 21/0475* (2013.01); *H01L 29/1095* (2013.01); *H01L 29/1608* (2013.01); *H01L 29/66068* (2013.01); *H01L 29/7813* (2013.01)

(58) Field of Classification Search
CPC ......... H01L 21/02529; H01L 21/02579; H01L 21/046; H01L 21/0475; H01L 29/0634; H01L 29/1095; H01L 29/1608; H01L 29/66068; H01L 29/7813
See application file for complete search history.

(56) References Cited

U.S. PATENT DOCUMENTS 8,653,628 B1 *   2/2014   Song ....................... H01L 29/36
                                                                   257/341
2009/0272982 A1   11/2009  Nakamura et al.
(Continued)

FOREIGN PATENT DOCUMENTS

| JP | 2015-019092 A | 1/2015 |
| JP | 2018-060894 A | 4/2018 |

*Primary Examiner* — Joseph M Galvin, III
(74) *Attorney, Agent, or Firm* — Oliff PLC

(57) ABSTRACT

A semiconductor device includes a compound semiconductor substrate including a gate region and an active region, a trench provided in a range between the gate region and the active region, a gate insulating film disposed in the trench, a source electrode, and a drain electrode. The gate region includes a first gate region of a p-type being in contact with the gate insulating film, a second gate region of the p-type having a p-type impurity concentration lower than a p-type impurity concentration of the first gate region, a third gate region of an n-type, and a fourth gate region of the p-type. The active region includes a source region of the n-type being in contact with the gate insulating film, a body region of the p-type facing the second gate region via the gate insulating film, and a drain region of the n-type.

7 Claims, 12 Drawing Sheets

(56) References Cited

U.S. PATENT DOCUMENTS

2012/0049270 A1* 3/2012 Hirler ................. H01L 29/6634
                                                        257/328
2012/0132956 A1   5/2012 Pfirsch et al.
2014/0009189 A1   1/2014 Mauder et al.
2015/0115286 A1* 4/2015 Takeuchi ............ H01L 21/8213
                                                         257/77

* cited by examiner

SEMICONDUCTOR DEVICE

TECHNICAL FIELD

The disclosure herewith relates to a semiconductor device.

BACKGROUND

Japanese Patent Application Publication No. 2015-019092 discloses a semiconductor device including a compound semiconductor substrate, a gate trench provided in an upper surface of the compound semiconductor substrate, and an intersection trench provided in the upper surface of the compound semiconductor substrate and having a depth larger than a depth of the gate trench. An inner surface of the gate trench is covered with an insulating film. A gate electrode is disposed in the gate trench. A source electrode is disposed in the intersection trench. Furthermore, the source electrode covers the upper surface of the compound semiconductor substrate. In this semiconductor device, the compound semiconductor substrate includes a source region, a body region, and a drift region. The source region is in contact with the insulating film and the source electrode. The body region is in contact with the insulating film below the source region. The drift region is in contact with the insulating film below the body region. The drift region is in Schottky contact with the source electrode at a lower end of the intersection trench.

SUMMARY

In the semiconductor device in Japanese Patent Application Publication No. 2015-019092, the intersection trench having the depth larger than the depth of the gate trench is formed next to the gate trench. In the intersection trench, the source electrode being in Schottky contact with the drift region is formed. When this semiconductor device is turned off, a depletion layer that extends from an interface between the source electrode and the drift region (i.e., a Schottky contact surface) into the drift region extends toward a bottom surface of the gate trench. The bottom surface of the gate trench is at a position shallower than a position of a bottom surface of the intersection trench. Accordingly, the periphery of the bottom surface of the gate trench is depleted, and electric field concentration in the vicinity of the bottom surface of the gate trench is suppressed. In other words, electric field concentration on the insulating film in the vicinity of the bottom surface of the gate trench can be relieved.

In this semiconductor device, however, owing to the depletion layer that extends from the interface between the source electrode and the drift region the Schottky contact surface) into the drift region, a path through which current can flow is narrowed. Consequently, an on-resistance is increased. The present specification discloses an art with which electric field concentration on the insulating film can be relieved and an increase in on-resistance can be suppressed.

A semiconductor device disclosed herein may comprise a compound semiconductor substrate including a gate region and an active region, a trench provided in an upper surface of the compound semiconductor substrate and provided in a range between the gate region and the active region, a gate insulating film disposed in the trench, a source electrode provided on an upper surface of the active region, a drain electrode provided on a lower surface of the compound semiconductor substrate, and a gate wiring provided on an upper surface of the gate region. The gate region may comprises a first gate region of a p-type being in contact with the gate insulating film and being connected to the gate wiring, a second gate region of the p-type being in contact with the gate insulating film below the first gate region and having a p-type impurity concentration lower than a p-type impurity concentration of the first gate region, a third gate region of an n-type being in contact with the gate insulating film below the second gate region, and a fourth gate region of the p-type being in contact with the gate insulating film below the third gate region and being in contact with the drain electrode. The active region may comprise a source region of the n-type being in contact with the source electrode and the gate insulating film, a body region of the p-type being in contact with the source electrode, being in contact with the gate insulating film below the source region, and facing the second gate region via the gate insulating film, and a drain region of the n-type being in contact with the gate insulating film below the body region and being in contact with the drain electrode.

When the semiconductor device described above is used, a voltage is applied between the drain electrode and the source electrode, the voltage causing the drain electrode to have a high potential. Moreover, a potential of the gate wiring is controlled to change between an on-potential higher than a potential of the source electrode and lower than a potential of the drain electrode, and an off-potential lower than the on-potential.

In an off state of the semiconductor device, the off-potential (a low potential) is applied to the source electrode. Moreover, in the off state of the semiconductor device, the potential of the drain electrode is much higher than the potential of the source electrode. Since the gate wiring is connected to the first gate region, and the first gate region has a high p-type impurity concentration, a potential of the first gate region is approximately equal to the potential of the gate wiring (the off-potential). Moreover, since the drain electrode is in contact with the fourth gate region, a potential of the fourth gate region is approximately equal to the potential of the drain electrode. Moreover, when the drain electrode has a high potential, a forward voltage is applied to a pn junction at an interface between the fourth gate region and the third gate region, and hence a potential of the third gate region is approximately equal to the potential of the fourth gate region. Since a reverse voltage is applied to a pa junction at an interface between the third gate region and the second gate region, a state occurs in which a depletion layer extends from the third gate region to the second gate region. Therefore, a lower end of the second gate region (an end portion on the third gate region side) has a potential approximately equal to the potential of the drain electrode, and an upper end of the second gate region (an end portion on the first gate region side) has a potential approximately equal to the off-potential, causing a potential distribution in which a potential gradually decreases from the lower end toward the upper end of the second gate region. Moreover, in the off state of the semiconductor device, the source region has a potential approximately equal to the potential of the source electrode, and the drain region has a potential approximately equal to the potential of the drain electrode. Since a reverse voltage is applied to a pa junction at an interface between the drain region and the body region, a state occurs in which a depletion layer extends from the drain region to the body region. Therefore, a lower end of the body region (an end portion on the drain region side) has a potential approximately equal to the potential of the drain electrode, and an upper end of the body region (an end portion on the source region side) has a potential approximately equal to the potential of the source electrode, causing a potential distribution in which a potential gradually decreases from the lower end toward the upper end of the body region. As such, in both of the second gate region and the body region that face each other via the gate insulating film, the potential distribution is obtained in which the potential gradually decreases from the lower end toward the upper end, and hence a potential difference made between the second gate region and the body region is small at each depth. Accordingly, in this semiconductor device, an electric field applied to the gate insulating film in the off state is small. This semiconductor device therefore has a high breakdown voltage.

When the potential of the gate wiring is raised, the potential of the upper end of the second gate region rises. Therefore, in a vicinity of the upper end of the second gate region, a potential of the second gate region becomes higher than a potential of the body region. In a depth range where the potential of the second gate region is sufficiently higher than the potential of the body region, carriers are attracted to the gate insulating film, thereby causing the body region to turn to an n-type in a range in a vicinity of an interface between the body region and the gate insulating film. Consequently, a channel is formed in that range. When the potential of the gate wiring (i.e., the potential of the upper end of the second gate region) is raised, a gradient of the potential distribution in the second gate region becomes gentle and the potential of the entire second gate region rises, accordingly. The channel then extends downwardly along the interface between the body region and the gate insulating film, and connects the source region and the drain region. The semiconductor device is thereby turned on. In this semiconductor device, no unnecessary depletion layer extends in the active region, and hence a current path is not restricted in the on state. Accordingly, a low on-resistance can be realized.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor device, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
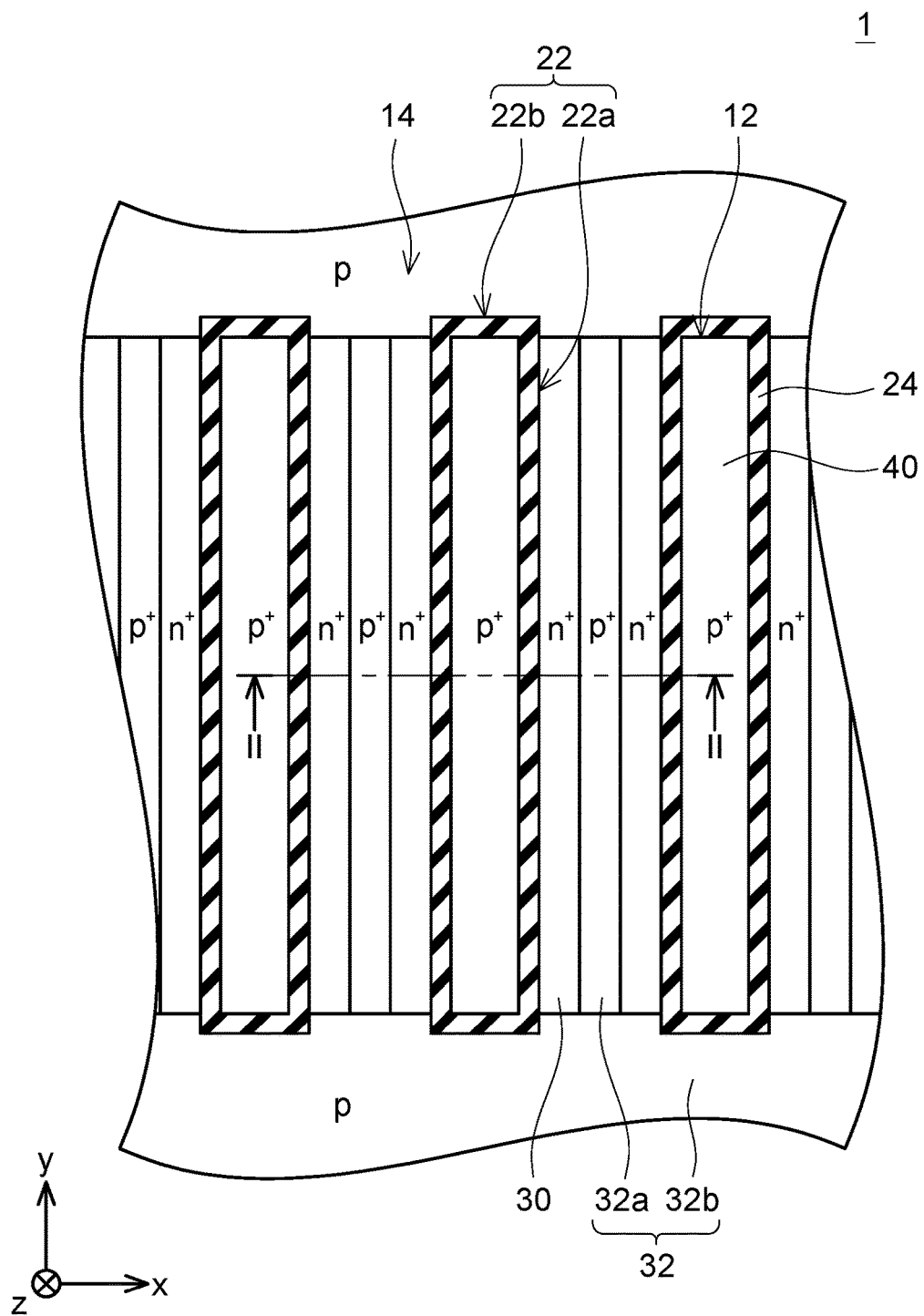
FIG. 1 is a top view of a semiconductor device of a first embodiment.
Figure 2:
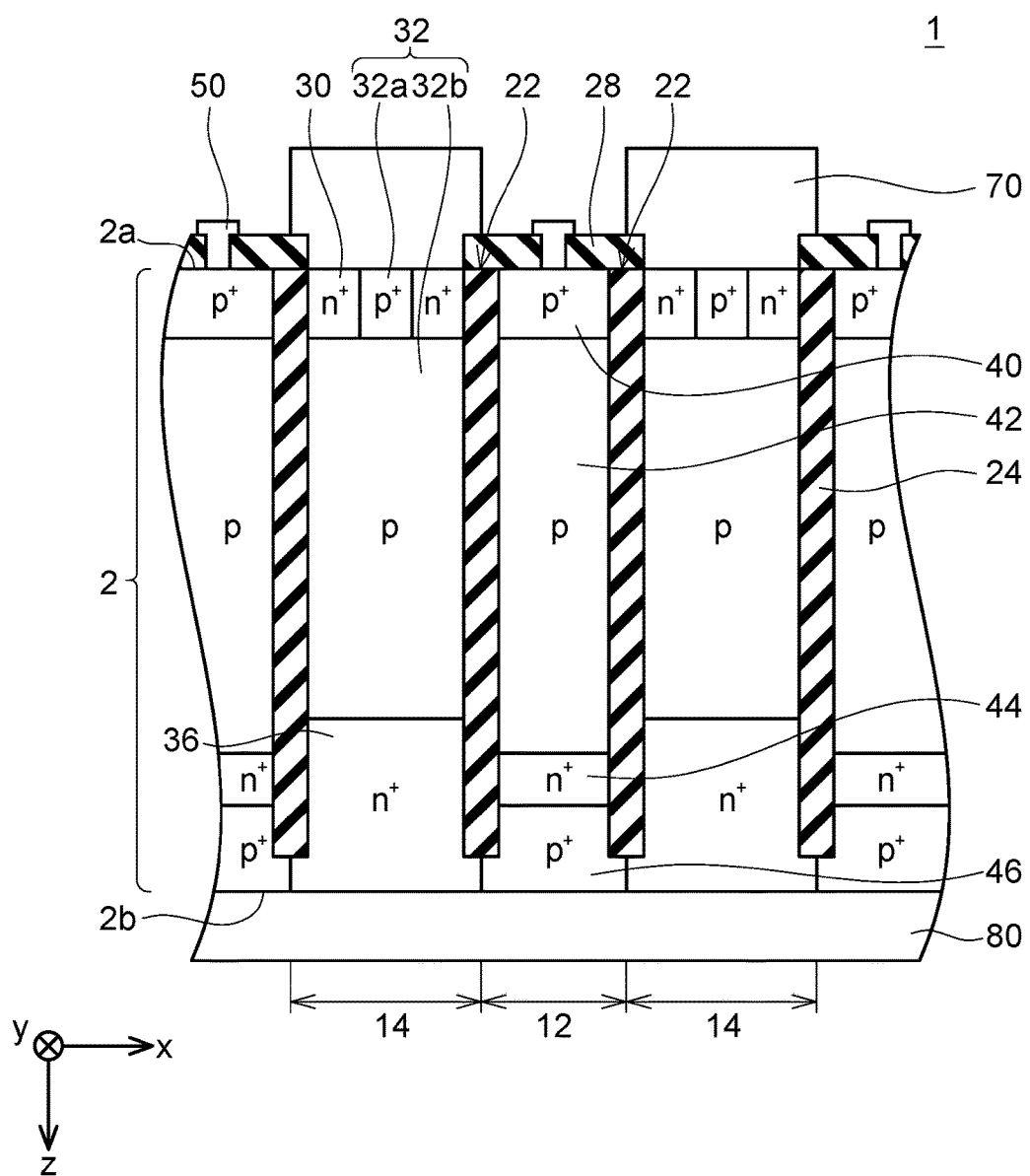
FIG. 2 is a cross-sectional view taken along a line II-II of FIG. 1.

FIGS. 1 and 2 each show a semiconductor device 1 of a first embodiment. As shown in FIG. 2, the semiconductor device 1 has a compound semiconductor substrate 2 (hereinafter simply referred to as a semiconductor substrate 2), source electrodes 70, a drain electrode 80, gate wirings 50, insulating films, and the like. The semiconductor substrate 2 is constituted of a compound semiconductor that has a band gap wider than a band gap of silicon (Si), and examples of a material that can be used for the semiconductor substrate 2 include silicon carbide (SiC), gallium nitride (GaN), and the like. In the present embodiment, the semiconductor substrate 2 is constituted of SiC. It should be noted that, in FIG. 1, a configuration positioned above an upper surface 2a of the semiconductor substrate 2 is not shown for ease of viewing the drawing. In the following, a direction parallel to the upper surface 2a of the semiconductor substrate 2 will be referred to as an x-direction, a direction parallel to the upper surface 2a and orthogonal to the x-direction will be referred to as a y-direction, and a thickness direction of the semiconductor substrate 2 will be referred to as a z-direction.

As shown in FIG. 2, the semiconductor substrate 2 has gate regions 12 and an active region 14. Each of the gate regions 12 is a region that formations as a gate when the semiconductor device 1 is turned on and off. The active region 14 is a region that functions as a current-carrying path when the semiconductor device 1 is on.

In the upper surface 2a of the semiconductor substrate 2, a plurality of trenches 22 is provided. As shown in FIG. 1, each of the trenches 22 has two longitudinal portions 22a each extending long in the y-direction, and two lateral portions 22b each extending in the x-direction and connecting end portions of the two longitudinal portions 22a each other. Each trench 22 is formed into a rectangular frame shape, in a plan view, by the two longitudinal portions 22a and the two lateral portions 22b. The trenches 22 are arranged to be spaced apart from each other in the x-direction. A region positioned on an inner circumferential side of each trench 22 is the gate region 12. A region positioned on an outer circumferential side of each trench 22 is the active region 14. In other words, a plurality of the gate regions 12 and the active region 14 that surrounds each of the gate regions 12 are provided in the semiconductor substrate 2. As shown in FIGS. 1 and 2, a gate insulating film 24 is disposed in each trench 22 with no gap left.

As shown in FIG. 2, an upper surface of each gate region 12 is covered with an interlayer insulating film 28. Each of the gate wirings 50 is provided on an upper surface of the corresponding interlayer insulating film 28, penetrates the interlayer insulating film 28, and reaches the upper surface 2a of the semiconductor substrate 2. Moreover, the source electrodes 70 are provided on an upper surface of the active region 14. The source electrodes 70 are in contact with the upper surface 2a of the semiconductor substrate 2 in a portion where the interlayer insulating films 28 are not provided (i.e., in a range of the active region 14). Each gate region 12 is insulated from the source electrode 70 by the corresponding interlayer insulating film 28. Gate wirings 50 and the source electrodes 70 are insulated from each other. The drain electrode 80 is provided on a lower surface 2b of the semiconductor substrate 2. The drain electrode 80 is in contact with the lower surface 2b of the semiconductor substrate 2.

Next, an internal configuration of each gate region 12 will be described. The gate regions 12 each have approximately the same configuration, and hence only a configuration of one gate region 12 will be described. As shown in FIG. 2, the gate region 12 has a first gate region 40, a second gate region 42, a third gate region 44, and a fourth gate region 46 provided therein.

The first gate region 40 is a p-type region. The first gate region 40 is disposed in a range located at the upper surface 2a of the semiconductor substrate 2, and is in contact with the interlayer insulating film 28. Moreover, the first gate region 40 is in contact with the gate insulating film 24. The first gate region 40 is connected to the gate wiring 50. The gate wiring 50 is connected to a bonding pad at a position not shown. Accordingly, a potential of the first gate region 40 can be controlled externally via the bonding pad and the gate wiring 50. In the present embodiment, the first gate region 40 has a p-type impurity concentration of $1\times10^{19}$ cm$^{-3}$ or more.

The second gate region 42 is a p-type region. As shown in FIG. 2, the second gate region 42 is disposed below the first gate region 40, and is in contact with the first gate region 40. The second gate region 42 is in contact with the gate insulating film 24 below the first gate region 40. The second gate region 42 has a p-type impurity concentration lower than the p-type impurity concentration of the first gate region 40. In the present embodiment, the second gate region 42 has a p-type impurity concentration less than $1\times10^{19}$ cm$^{-3}$.

The third gate region 44 is an n-type region. The third gate region 44 is disposed below the second gate region 42, and is in contact with the second gate region 42. The third gate region 44 is separated from the first gate region 40 by the second gate region 42. The third gate region 44 is in contact with the gate insulating film 24 below the second gate region 42.

The fourth gate region 46 is a p-type region. The fourth gate region 46 is disposed below the third gate region 44, and is in contact with the third gate region 44. The fourth gate region 46 is separated from the second gate region 42 by the third gate region 44. The fourth gate region 46 is in contact with the gate insulating film 24 below the third gate region 44. The fourth gate region 46 is disposed in a range located at the lower surface 2b of the semiconductor substrate 2. The fourth gate region 46 is in ohmic contact with the drain electrode 80.

Next, an internal configuration of the active region 14 will be described. As shown in FIG. 2, the active region 14 has a plurality of source regions 30, a body region 32, and drain regions 36 provided therein.

Each of the source regions 30 is an n-type region. Each source region 30 is disposed in the range located at the upper surface 2a of the semiconductor substrate 2, and is in ohmic contact with the corresponding source electrode 70. Each source region 30 is in contact with the corresponding gate insulating film 24 on an outer side surface of corresponding one of the longitudinal portions 22a of the trench 22. Each source region 30 is in contact with the corresponding gate insulating film 24 at an upper end portion of the semiconductor substrate 2.

The body region 32 is a p-type region. The body region 32 is in contact with source regions 30. The body region 32 extends from a range between the two source regions 30 to a position below each source region 30. The body region 32 has high concentration regions 32a and a low concentration region 32b. Each high concentration region 32a has a p-type impurity concentration higher than the low concentration region 32b does. Each high concentration region 32a is disposed in the range between the two source regions 30 so as to be located at the upper surface 2a. The high concentration regions 32a are in ohmic contact with the source electrodes 70. The low concentration region 32b is in contact with the gate insulating film 24 below the source regions 30. Moreover, as shown in FIG. 1, the low concentration region 32b is also disposed in a range adjacent to outer side surfaces of the lateral portions 22b of the trenches 22. The low concentration region 32b is in contact with the gate insulating films 24 at the outer side surfaces of the lateral portions 22b of the trenches 22. As shown in FIG. 2, an upper end of the low concentration region 32b in a range in contact with each gate insulating film 24 below the corresponding source region 30 (i.e., the low concentration region 32b in a range adjacent to the outer side surface of corresponding longitudinal portion 22a of the trench 22) is positioned at approximately the same depth as an upper end of each second gate region 42 in a range in contact with the corresponding gate insulating film 24. Moreover, a lower end of the low concentration region 32b in the range in contact with each gate insulating film 24 is positioned above a lower end of each second gate region 42 in the range in contact with the corresponding gate insulating film 24. The low concentration region 32b faces each second gate region 42 via the corresponding gate insulating films 24. It should be noted that the upper end of the low concentration region 32b in the range in contact with each gate insulating film 24 below the corresponding source region 30 may be positioned above the upper end of each second gate region 42 in the range in contact with the corresponding gate insulating film 24.

The drain regions 36 are n-type regions. Each drain region 36 is disposed below the low concentration region 32b, and is in contact with the low concentration region 32b. Each drain region 36 is separated from the corresponding source regions 30 by the body region 32. Each drain region 36 is in contact with the corresponding gate insulating film 24 below the low concentration region 32b. Each drain region 36 is disposed in the range located at the lower surface 2b of the semiconductor substrate 2. The drain regions 36 are in ohmic contact with the drain electrode 80. Moreover, each drain region 36 is in contact with the corresponding fourth gate region 46 below the corresponding trench 22.

When this semiconductor device 1 is used, the semiconductor device 1, a load (e.g. a motor), and a power supply are connected in series. A power supply voltage is applied to a series circuit made of the semiconductor device 1 and the load. The power supply voltage is applied between the drain electrode 80 and the source electrodes 70 in such a direction as to allow the drain electrode 80 to have a high potential. Moreover, a potential of each gate wiring 50 is controlled to change between an on-potential higher than a potential of the source electrodes 70 and lower than a potential of the drain electrode 80, and an off-potential lower than the on-potential.

Figure 3:
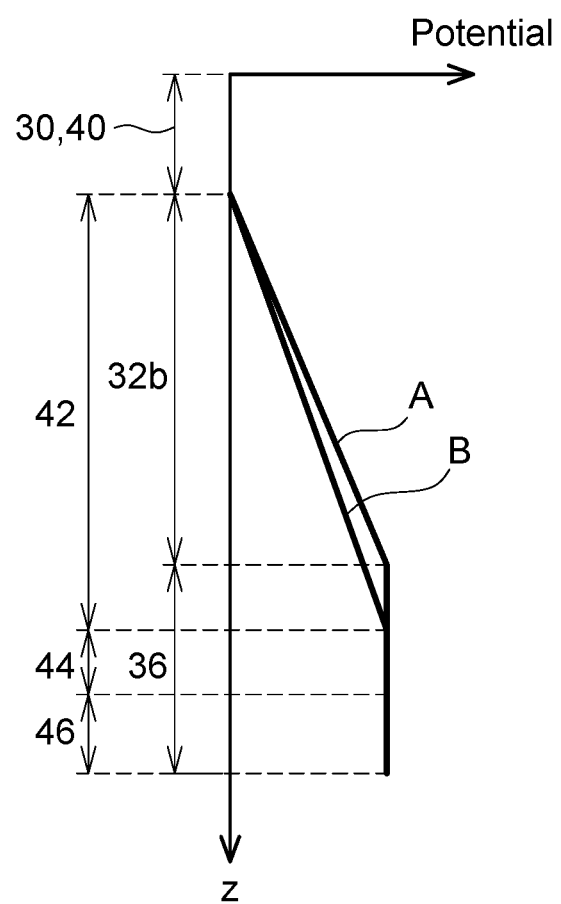
FIG. 3 is a diagram illustrating a potential distribution in the semiconductor device of the first embodiment in an off state in a thickness direction.

FIG. 3 illustrates potential distributions in the active region 14 and each gate region 12 in a state in which the potential of each gate wiring 50 is controlled to the off-potential (i.e., a state in which the semiconductor device 1 is off). In FIG. 3, an axis of ordinates shows a position in the z-direction, and an axis of abscissas shows a potential. It should be noted that in FIG. 3, the potential in the axis of abscissas is shown with the potential of the source electrode 70 set as a reference potential (0V). A graph A in FIG. 3 shows the potential distribution in the active region 14, while a graph B in FIG. 3 shows the potential distribution in each gate region 12. In the present embodiment, the off-potential is equal to or lower than the potential of the source electrode 70 (i.e., a potential equal to or lower than 0 V). Since the semiconductor device 1 is turned off a potential VH much higher than the potential of the source electrode 70 (a potential approximately equal to an output potential of the power supply) is applied to the drain electrode 80.

Since each gate wiring 50 is connected to the corresponding first gate region 40, and each first gate region 40 has a high p-type impurity concentration, a potential of the first gate region 40 is approximately equal to the potential of each gate wiring 50 (the off-potential). Moreover, since the drain electrode 80 is in contact with the fourth gate regions 46, a potential of each third gate region 46 is approximately equal to the potential of the drain electrode 80 (i.e., the high potential VH). Moreover, when the high potential VH is applied to the drain electrode 80, a forward voltage is applied to a pn junction at an interface between each fourth gate region 46 and the corresponding third gate region 44, and hence a potential of each third gate region 44 is approximately equal to the potential of the corresponding fourth gate region 46 (i.e., the high potential VH). Moreover, since a reverse voltage is applied to a pn junction at an interface between each third gate region 44 and the corresponding second gate region 42, a state occurs in which a depletion layer extends from each third gate region 44 to the corresponding second gate region 42. Therefore, the lower end of each second gate region 42 (an end portion on the third gate region 44 side) has a potential approximately equal to the potential of the drain electrode 80, and the upper end of each second gate region 42 (an end portion on the first gate region 40 side) has a potential approximately equal to the off-potential, causing a potential distribution in which a potential gradually decreases from the lower end toward the upper end of each second gate region 42.

Moreover, in the off state of the semiconductor device 1, each source region 30 has a potential approximately equal to the potential of the source electrodes 70 (i.e., 0 V), and each drain region 36 has a potential approximately equal to the potential of the drain electrode 80 (i.e., the high potential VH). Since a reverse voltage is applied to a pn junction at an interface between each drain region 36 and the body region 32 (the low concentration region 32b), a state occurs in which a depletion layer extends from each drain region 36 to the body region 32 (the low concentration region 32b). Therefore, a lower end of the body region 32 (an end portion on the drain region 36 side) has a potential approximately equal to the potential of the drain electrode 80, and an upper end of the body region 32 (an end portion on the source region 30 side) has a potential approximately equal to the potential of the source electrodes 70, causing a potential distribution in which a potential gradually decreases from the lower end toward the upper end of the body region 32.

As such, in both of each second gate region 42 and the body region 32 that face each other via the corresponding gate insulating film 24, the potential distribution is obtained in which the potential gradually decreases from the lower end toward the upper end. In the range in contact with each gate insulating film 24, the upper end of the body region 32 (the low concentration region 32b) is positioned at approximately the same depth as the upper end of each second gate region 42, and the lower end of the body region 32 is positioned above the lower end of each second gate region 42. Accordingly, in the entire range where the body region 32 and each second gate region 42 face each other, a potential of each second gate region 42 (i.e., the graph B) is lower than a potential of the body region 32 (i.e., the graph A). Therefore, no channel is formed in the body region 32, and the semiconductor device 1 remains off.

Moreover, in both of each second gate region 42 and the body region 32, the potential is distributed to gradually decrease from the lower end toward the upper end, and hence a potential difference made between each second gate region 42 and the body region 32 is small at each depth.

Accordingly, in this semiconductor device 1, an electric field applied to each gate insulating film 24 in the off state is small. This semiconductor device 1 therefore has a high breakdown voltage.

Figure 4:
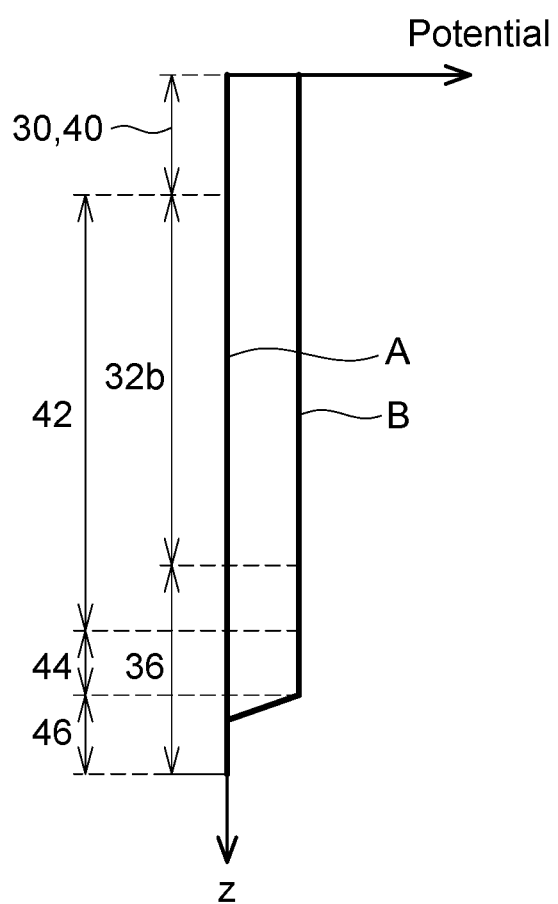
FIG. 4 is a diagram illustrating a potential distribution in the semiconductor device of the first embodiment in an on state in the thickness direction.

When the potential of each gate wiring 50 is raised, a potential of the upper end of the corresponding second gate region 42 rises. Therefore, in the vicinity of the upper end of each second gate region 42, the potential of the second gate region 42 becomes higher than the potential of the body region 32. In a depth range where the potential of each second gate region 42 is sufficiently higher than the potential of the body region 32, carriers are attracted to the corresponding gate insulating film 24, thereby causing the body region 32 to turn to an n-type in a range in the vicinity of an interface between the body region 32 and the corresponding gate insulating film 24. Consequently, a channel is formed in that range. When the potential of each gate wiring 50 (i.e., the potential of the upper end of each second gate region 42 is raised, a gradient of the potential distribution in each second gate region 42 becomes gentle and the potential of the entire second gate region 42 rises, accordingly. The channel then extends downwardly along the interface between the body region 32 and each gate insulating film 24, and connects each source region 30 and the corresponding drain region 36. The semiconductor device 1 is thereby turned on. When the semiconductor device 1 is turned on, the potential of the drain electrode 80 decreases to a low potential (a potential close to 0 V). Accordingly, as shown in FIG. 4, each of a potential of each drain region 36 and the potential of each fourth gate region 46 decreases to a low potential (a potential close to 0 V). When the potential of each drain region 36 decreases to the low potential, the potential of approximately the entire body region 32 becomes low. On the other hand, even if the potential of each fourth gate region 46 becomes low, a reverse voltage is applied to the pn junction at the interface between each fourth gate region 46 and the corresponding third gate region 44, and hence the potential of each third gate region 44 is maintained at the on-potential. Accordingly, the potential of approximately the entire second gate region 42 becomes the on-potential. Since the entire second gate region 42 has a potential higher than the potential of the entire body region 32, the channel is maintained. The on state of the semiconductor device 1 is therefore maintained. Subsequently, when the potential of each gate wiring 50 (i.e., the potential of each first gate region 40) is decreased to a low potential, the channel disappears from the body region 32, and the semiconductor device 1 is turned off. The potential distribution inside the semiconductor device 1 then returns to the potential distribution shown in FIG. 3. As such, the semiconductor device 1 can be switched by changing the potential of each gate wiring 50.

As described above, in this semiconductor device 1 in the off state, the potential distribution in which the potential gradually increases from the upper side toward the lower side is caused in the active region 14 as well as each gate region 12, to thereby suppress a large potential difference between the active region 14 and each gate region 12. Accordingly, in this semiconductor device 1, a high electric field is less likely to be applied to the gate insulating film 24. This semiconductor device 1 therefore has a high breakdown voltage. Moreover, in this semiconductor device 1 in the on state, no unnecessary depletion layer extends in the active region 14, and hence a current path is not restricted in the on state. Accordingly, a low on-resistance can be realized.

Figure 5:
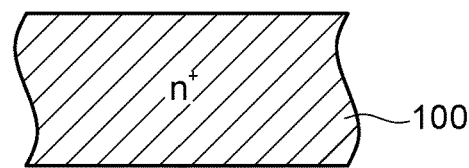
FIG. 5 is a cross-sectional view illustrating a step of manufacturing the semiconductor device of the first embodiment.
Figure 6:
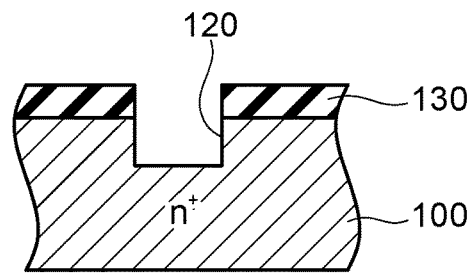
FIG. 6 is a cross-sectional view illustrating a step of manufacturing the semiconductor device of the first embodiment.

Next, a method of manufacturing the semiconductor device 1 in First Embodiment will be described. Initially, as shown in FIG. 5, a SiC substrate 100 is prepared, the entirety of which includes n-type SiC. Next, as shown in FIG. 6, an etching mask 130 having openings is formed on an upper surface of the SiC substrate 100. Next, a portion of the SiC substrate 100 positioned in each opening is etched by dry etching. Recesses 120 are thereby formed in the upper surface of the SiC substrate 100.

Figure 7:
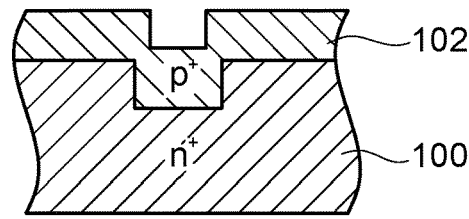
FIG. 7 is a cross-sectional view illustrating a step of manufacturing the semiconductor device of the first embodiment.
Figure 8:
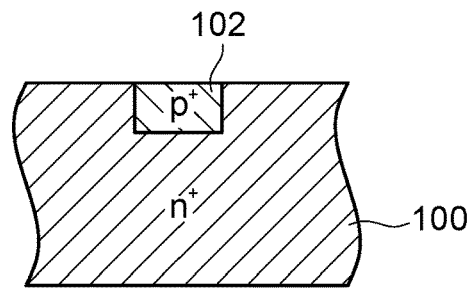
FIG. 8 is a cross-sectional view illustrating a step of manufacturing the semiconductor device of the first embodiment.

Next, as shown in FIG. 7, on the upper surface of the SiC substrate 100 and an inner surface of the each recess 120, a first SiC layer 102 including p-type SiC is grown by epitaxial growth. Here, the first SiC layer 102 is gown until a gap in the recess 120 is filled. Once the first SiC layer 102 is grown, an upper surface of the first SiC layer 102 is etched to be planarized as shown in FIG. 8. At this time, the etching is performed until the first SiC layer 102 formed on the upper surface of the SiC substrate 100 in a range except for the each recess 120 is completely removed.

Figure 9:
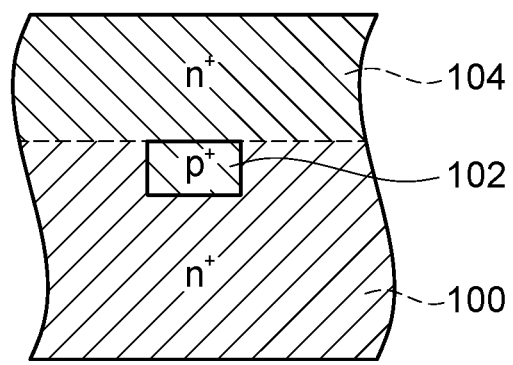
FIG. 9 is a cross-sectional view illustrating a step of manufacturing the semiconductor device of the first embodiment.

Next, as shown in FIG. 9, a second SiC layer 104 including n-type SiC is grown, by epitaxial growth, on the upper surface of the SiC substrate 100 and the upper surface of the first SiC layers 102. The second SiC layer 104 has an impurity concentration approximately equal to an n-type impurity concentration of the SiC substrate 100. Accordingly, the second SiC layer 104 and the SiC substrate 100 are made into an integral n-type semiconductor region.

Figure 10:
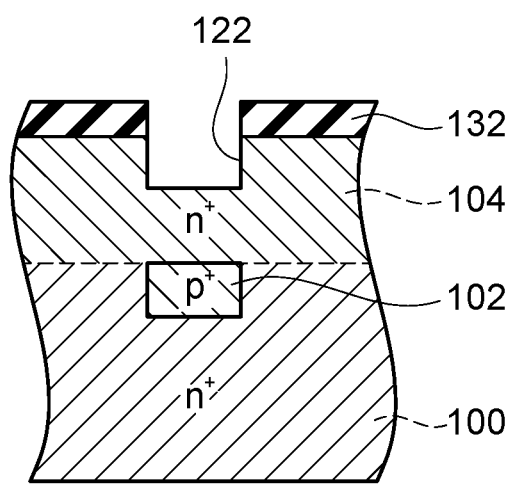
FIG. 10 is a cross-sectional view illustrating a step of manufacturing the semiconductor device of the first embodiment.

Next, as shown in FIG. 10, an etching mask 132 having openings is formed on an upper surface of the second SiC layer 104. Next, a portion of the second SiC layer 104 positioned in each opening is etched by dry etching. Recesses 122 are thereby formed in the upper surface of the second SiC layer 104.

Figure 11:
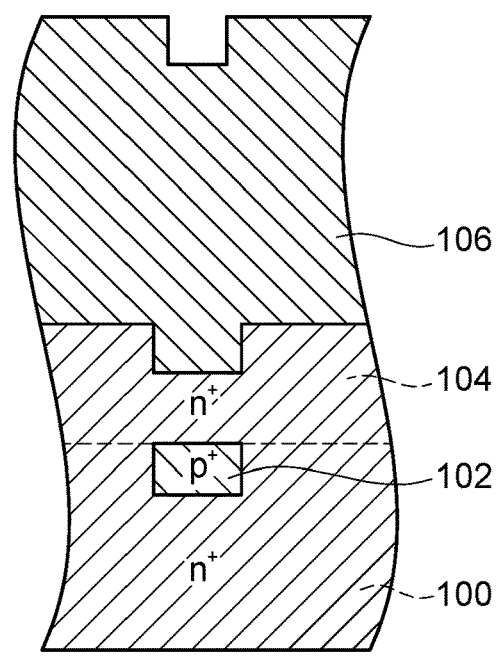
FIG. 11 is a cross-sectional view illustrating a step of manufacturing the semiconductor device of the first embodiment.
Figure 12:
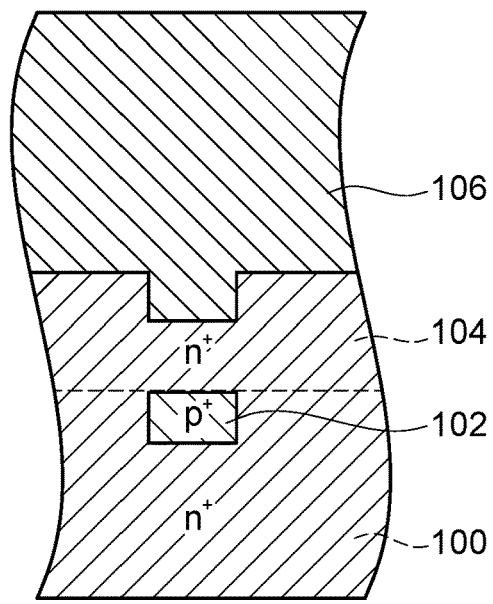
FIG. 12 is a cross-sectional view illustrating a step of manufacturing the semiconductor device of the first embodiment.

Next, as shown in FIG. 11, a third SiC layer 106 including p-type SiC is grown, by epitaxial growth, on the upper surface of the second SiC layer 104 and an inner surface of the recesses 122. Here, the third SiC layer 106 is grown until a gap in the recesses 122 is filled. The third SiC layer 105 has a p-type impurity concentration lower than a p-type impurity concentration of the first SiC layer 102. Once the third SiC layer 106 is grown, an upper surface of the third SiC layer 106 is etched to be planarized as shown in FIG. 12.

Figure 13:
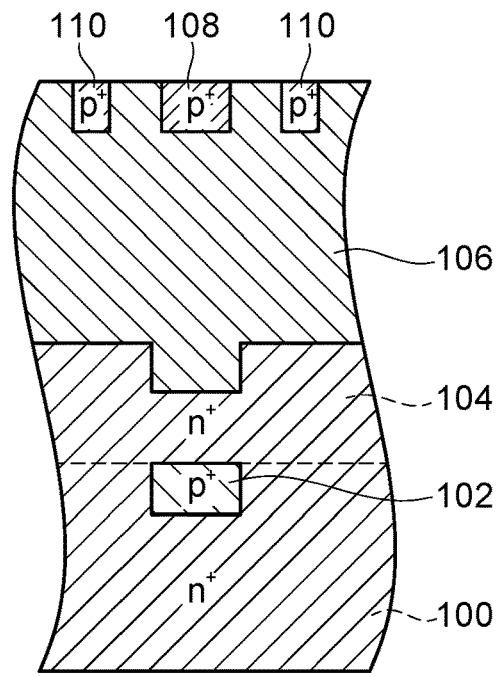
FIG. 13 is a cross-sectional view illustrating a step of manufacturing the semiconductor device of the first embodiment.

Next, p-type impurities are selectively implanted from an upper surface side of the third SiC layer 106 to thereby form p-type regions 108 and 110 as shown in FIG. 13. Each p-type region 108 is formed to be positioned immediately above the corresponding first SiC layer 102. Each p-type region 110 is formed at a position spaced apart from the corresponding p-type region 103. The p-type regions 108 and 110 each have a p-type impurity concentration higher than the p-type impurity concentration of the third SiC layer 106.

Figure 14:
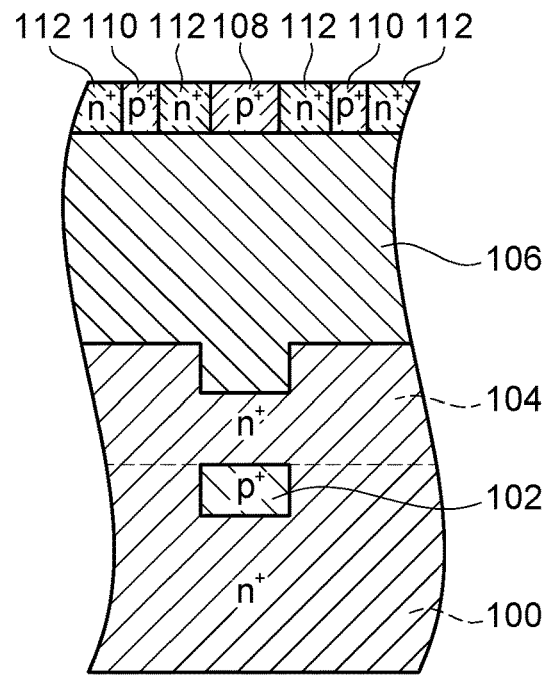
FIG. 14 is a cross-sectional view illustrating a step of manufacturing the semiconductor device of the first embodiment.

Next, n-type impurities are selectively implanted from the upper surface side of the third SiC layer 106 to thereby form n-type regions 112 as shown in FIG. 14.

Figure 15:
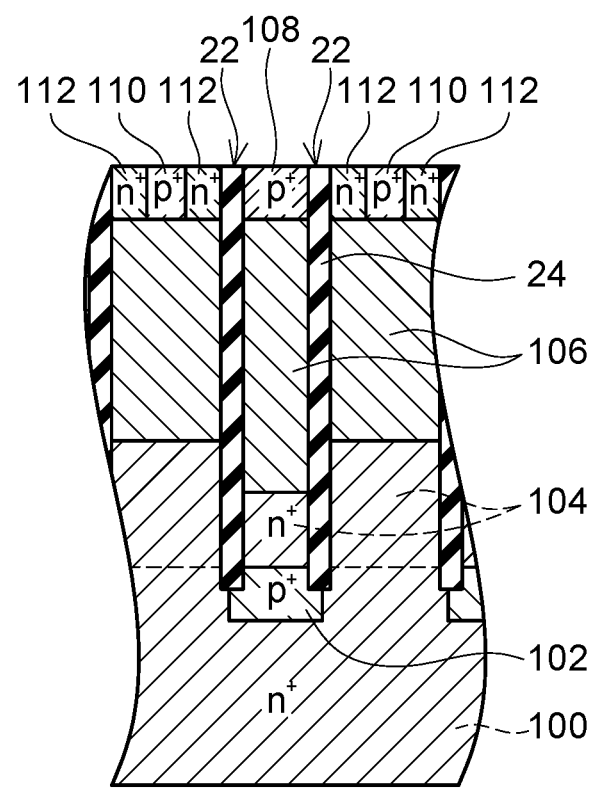
FIG. 15 is a cross-sectional view illustrating a step of manufacturing the semiconductor device of the first embodiment.

Next, as shown in FIG. 15, trenches 22 are formed in the upper surface of the third SiC layer 106, and each gate insulating film 24 is formed to fill the corresponding trench 22. Each trench 22 is formed to surround the corresponding p-type region 108 in a plan view. Each trench 22 is formed to a depth at which the trench 22 reaches the first SiC layer 102.

Figure 16:
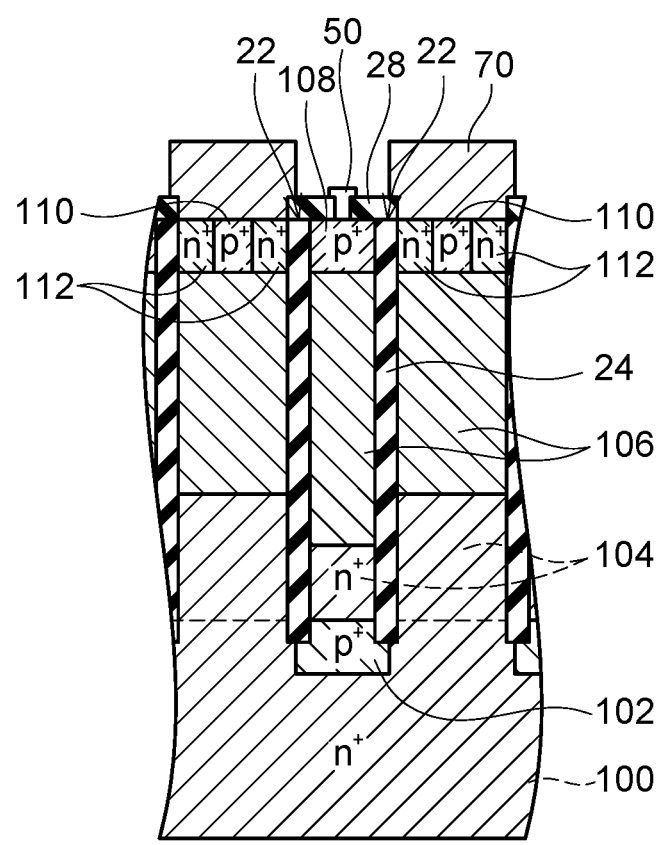
FIG. 16 is a cross-sectional view illustrating a step of manufacturing the semiconductor device of the first embodiment.

Next, as shown in FIG. 16, each interlayer insulating film 28 is formed to cover an upper surface of the corresponding p-type region 108. Next, each gate wiring 50 is formed to reach the corresponding p-type region 108 from the upper surface of the corresponding interlayer insulating film 28, and the source electrodes 70 are formed to cover the upper surface of the third SiC layers 106. Subsequently, the SiC substrate 100 is ground from a lower surface to expose a lower surface of the first SiC layer 102 and a lower surface of the second SiC layer 104. The drain electrode 80 is then formed on the lower surface of the first SiC layer 102 and the lower surface of the second SiC layer 104, to thereby complete the semiconductor device 1 shown in FIG. 2.

Second Embodiment

Next, a semiconductor device in second embodiment will be described. In the following, only a configuration different from that in first embodiment will be described, and a configuration similar to that in first embodiment has the same numeral attached thereto, and detailed description thereof will be omitted.

Figure 17:
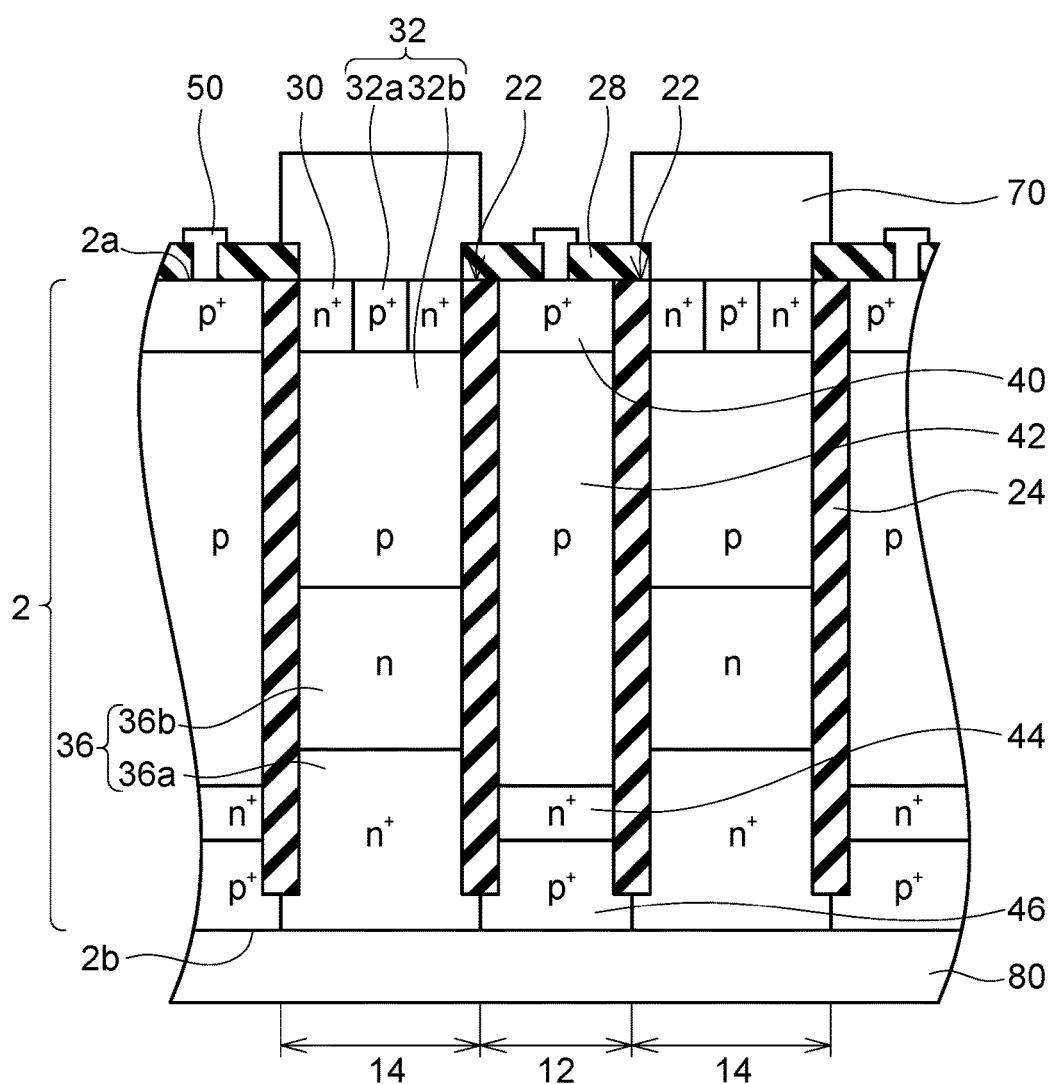
FIG. 17 is a cross-sectional view of a semiconductor device of a second embodiment (and corresponds to FIG. 2)

As shown in FIG. 17, each of the drain regions 36 has a low concentration region 36b and a high concentration region 36a. Each low concentration region 36b is an n-type region. Each low concentration region 36b is in contact with the corresponding low concentration region 32b in the body region 32 and the corresponding high concentration region 36a in the drain region 36. Each low concentration region 36b is in contact with the corresponding gate insulating film 24 below the corresponding low concentration region 32b. Each low concentration region 36b is in contact with the corresponding gate insulating film 24 above the corresponding high concentration region 36a. Each low concentration region 36b has an n-type impurity concentration lower than an n-type impurity concentration of each high concentration region 36a. The low concentration region 36b faces the corresponding second gate region 42 via the corresponding gate insulating film 24.

In the semiconductor device n second embodiment in the on state, the entire range of the low concentration region 36b having a cross-sectional area larger than a cross-sectional area of the channel formed in the low concentration region 32b can be used as a current path. Accordingly, an on-resistance can be reduced. Moreover, since the low concentration region 36b has a lower n-type impurity concentration than each high concentration region 36a does, a depletion layer spreads in the low concentration region 36b in the off state of the semiconductor device. Therefore, the potential is distributed to gradually decrease from a lower end toward an upper end of the low concentration region 36b. In addition, the low concentration region 36b and each low concentration region 32b face the corresponding second gate region 42 via the corresponding gate insulating film 24. Therefore, the potential gradually decreases in both of the potential distribution from the lower end of the low concentration region 36b to the upper end of the low concentration region 32b, and the potential distribution from the lower end to the upper end of each second gate region 42. Therefore, a potential difference made between each second gate region 42 and a semiconductor region which is a combination of each low concentration region 32b and the low concentration region 36b is small at each depth. Accordingly, an electric field applied to the gate insulating films 24 in the off state can be made small.

Third Embodiment

Figure 18:
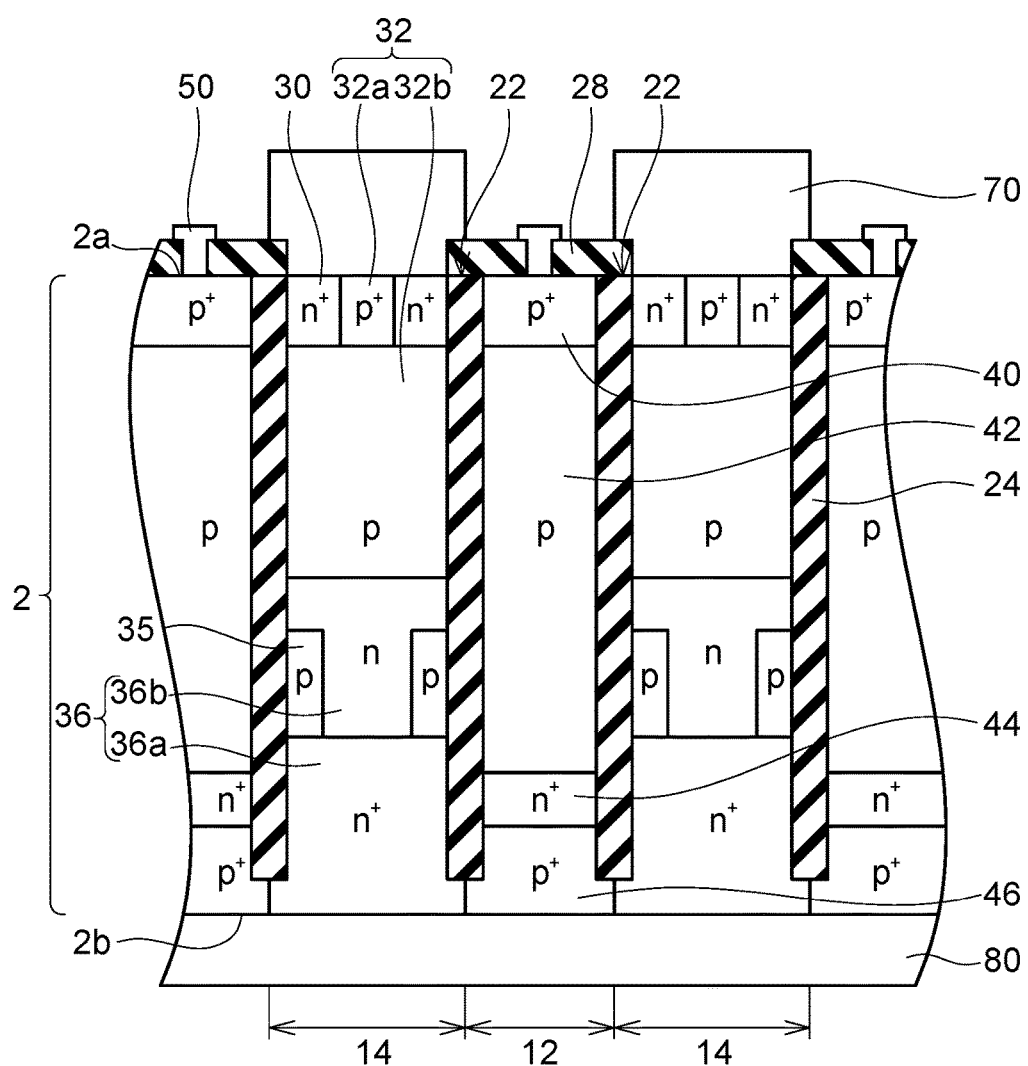
FIG. 18 is a cross-sectional view of a semiconductor device of a third embodiment (and corresponds to FIG. 2).

Next, a semiconductor device in third embodiment will be described. As shown in FIG. 18, the active region 14 further includes a plurality of drift regions 35. Each of the drift regions 35 is a p-type region. Each drift region 35 is in contact with the corresponding low concentration region 36b and the corresponding high concentration region 36a. Each drill region 35 is in contact with the corresponding gate insulating film 24 below the corresponding low concentration region 36b. Each drill region 35 is in contact with the corresponding gate insulating film 24 above the corresponding high concentration region 36a. Each drift region 35 is separated from the corresponding low concentration region 32b in the body region 32 by the corresponding low concentration region 36b in the drain region 36. Each low concentration region 36b extends from a range between two of the drift regions 35 to a position above each of the two drift regions 35, and is in contact with the corresponding gate insulating film 24 above each of the drift regions 35. Each high concentration region 36a is in contact with the corresponding drift region 35 in a range in contact with the gate insulating film 24, and is in contact with the low concentration region 36b in a range between the two drift regions 35. Each drift region 35 has an impurity concentration approximately equal to a p-type impurity concentration of each low concentration region 32b. The drift region 35 faces the second gate region 42 via the corresponding gate insulating film 24.

In the semiconductor device in third embodiment, a channel formed in each drift region 35 and each low concentration region 36b can be used as a current path in the on state of the semiconductor device. Accordingly, an on-resistance can be reduced. Moreover, since the drift region 35 has an impurity concentration approximately equal to the p-type impurity concentration of each low concentration region 32b, a depletion layer spreads in the drift region 35 in the off state of the semiconductor device. Therefore, a potential difference made between each second gate region 42 and a semiconductor region that is a combination of each drift region 35, the low concentration region 36b, and each low concentration region 32b is small. Accordingly, an electric field applied to the gate insulating film 24 in the off state can be made small.

The technologies disclosed in the present teachings will hereinafter be enumerated. It should be noted that technological elements below are useful independently of each other.

In a configuration disclosed herein as an example, an upper end of the body region in a range in contact with the gate insulating film may be positioned at a same depth as or above an upper end of the second gate region in a range in contact with the gate insulating film.

According to this configuration, in an off state of the semiconductor device, a potential in the vicinity of the upper end of the second gate region in the range in contact with the gate insulating film does not become higher than a potential of the body region in the range in contact with the gate insulating films, in the same depth range. Therefore, in the vicinity of the upper end of the body region, formation of a channel can be suppressed in the vicinity of an interface between the body region and the gate insulating film. That is, erroneous turn-on of the semiconductor device can be suppressed in a state in which an off-potential is applied to the gate wiring.

In a configuration disclosed herein as an example, a lower end of the body region in a range in contact with the gate insulating film may be positioned above a lower end of the second gate region in a range in contact with the gate insulating film.

According to this configuration, in an off state of the semiconductor device, a potential in the vicinity of the lower end of the body region in the range in contact with the gate insulating film does not become lower than a potential of the second gate region in the range in contact with the gate insulating film, in the same depth range. Therefore, in the vicinity of the lower end of the body region, formation of a channel can be suppressed in the vicinity of an interface between the body region and the gate insulating film. That is, erroneous turn-on of the semiconductor device can be suppressed in a state in which an off-potential is applied to the gate wiring.

In a configuration disclosed herein as an example, the drain region may comprise a low concentration region being in contact with the body region and facing the second gate region via the gate insulating film, and a high concentration region being in contact with the gate insulating film below the low concentration region, being in contact with the drain electrode, and having an impurity concentration higher than an impurity concentration of the low concentration region.

According to this configuration, in an on state of the semiconductor device, the entire range of each low concentration region having a cross-sectional area larger than a cross-sectional area of the channel formed in the body region can be used as a current path. Accordingly, an on-resistance can be reduced. Moreover, since each low concentration region has a lower n-type impurity concentration than each high concentration region does, a depletion layer spreads in each low concentration region in the off state of the semiconductor device. Therefore, a potential is distributed to gradually decrease from a lower end toward an upper end of the low concentration region. In addition, each low concentration region and the body region face the corresponding second gate region via the corresponding insulating film. Therefore, a potential gradually decreases in both of a potential distribution from the lower end of each low concentration region toward the upper end of the body region, and a potential distribution from the lower end toward the upper end of each second gate region, and hence a potential difference made between each second gate region and a semiconductor region that is a combination of the body region and each low concentration region is small at each depth. Accordingly, in the off state, an electric field applied to each gate insulating film can be made small.

In a configuration disclosed herein as an example, the active region may further comprise a drift region of the p-type being in contact with the low concentration region and the high concentration region, being in contact with the gate insulating film below the low concentration region and above the high concentration region, being separated from the body region by the low concentration region, and facing the second gate region via the gate insulating film.

According to this configuration, in an on state of the semiconductor device, a channel formed in the drift region and the first drift region can be used as a current path. Accordingly, an on-resistance can be reduced. Moreover, since the drift region has a low p-type impurity concentration, a depletion layer spreads in the drift region in an off state of the semiconductor device. Therefore, a potential difference made between the second gate region and a semiconductor region that is a combination of the drift region, the low concentration region, and the body region is small. Accordingly, in the off state, an electric field applied to the gate insulating film can be made small.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
a compound semiconductor substrate including a gate region and an active region;
a trench provided in an upper surface of the compound semiconductor substrate and provided in a range between the gate region and the active region;
a gate insulating film disposed in the trench;
a source electrode provided on an upper surface of the active region;
a drain electrode provided on a lower surface of the compound semiconductor substrate; and
a gate wiring provided on an upper surface of the gate region,
wherein
the gate region comprises:
a first gate region of a p-type being in direct contact with the gate insulating film and being in direct contact with the gate wiring;
a second gate region of the p-type being in direct contact with the gate insulating film below the first gate region and having a p-type impurity concentration lower than a p-type impurity concentration of the first gate region;
a third gate region of an n-type being in direct contact with the gate insulating film below the second gate region; and
a fourth gate region of the p-type being in direct contact with the gate insulating film below the third gate region and being in direct contact with the drain electrode,
the active region comprises:
a source region of the n-type being in direct contact with the source electrode and the gate insulating film;
a body region of the p-type being in direct contact with the source electrode, being in direct contact with the gate insulating film below the source region, and facing the second gate region via the gate insulating film; and
a drain region of the n-type being in direct contact with the gate insulating film below the body region and being in direct contact with the drain electrode.

2. The semiconductor device according to claim 1, wherein
an upper end of the body region in a range in direct contact with the gate insulating film is positioned above an upper end of the second gate region in a range in direct contact with the gate insulating film.

3. The semiconductor device according to claim 1, wherein
a lower end of the body region in a range in direct contact with the gate insulating film is positioned above a lower end of the second gate region in a range in direct contact with the gate insulating film.

4. The semiconductor device according to claim 1, wherein
the drain region comprises:
a low concentration region being in contact with the body region and facing the second gate region via the gate insulating film; and
a high concentration region being in contact with the gate insulating film below the low concentration region, being in contact with the drain electrode, and having an impurity concentration higher than an impurity concentration of the low concentration region.

5. The semiconductor device according to claim 4, wherein
the active region further comprises:
a drift region of the p-type being in contact with the low concentration region and the high concentration region, being in contact with the gate insulating film below the low concentration region and above the high concentration region, being separated from the body region by the low concentration region, and facing the second gate region via the gate insulating film.

6. The semiconductor device according to claim 1, wherein a conductive layer does not exist in the trench and an entirety of the trench is filled with the gate insulating film.

7. The semiconductor device according to claim 1, wherein the first gate region is insulated from the source electrode.

* * * * *